United States Patent
Kraft et al.

(10) Patent No.: US 8,633,107 B2
(45) Date of Patent: Jan. 21, 2014

(54) METHOD OF PRODUCING A SEMICONDUCTOR DEVICE AND SEMICONDUCTOR DEVICE HAVING A THROUGH-WAFER INTERCONNECT

(75) Inventors: Jochen Kraft, Oberaich (AT); Jordi Teva, Graz (AT)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 13/499,899

(22) PCT Filed: Sep. 28, 2010

(86) PCT No.: PCT/EP2010/064338
§ 371 (c)(1),
(2), (4) Date: Jul. 27, 2012

(87) PCT Pub. No.: WO2011/039167
PCT Pub. Date: Apr. 7, 2011

(65) Prior Publication Data
US 2012/0286430 A1 Nov. 15, 2012

(30) Foreign Application Priority Data

Oct. 1, 2009 (EP) .................................... 09012465

(51) Int. Cl.
*H01L 21/44* (2006.01)
(52) U.S. Cl.
USPC ........... 438/652; 438/667; 257/774; 257/758; 257/E21.597; 257/E23.011
(58) Field of Classification Search
USPC .................. 257/774, E21.597, E23.011, 758; 438/652, 667
See application file for complete search history.

(56) References Cited

U.S. PATENT DOCUMENTS

| 5,511,428 A | 4/1996 | Goldberg et al. |
| 6,110,825 A | 8/2000 | Mastromatteo et al. |
| 6,159,833 A | 12/2000 | Lee et al. |
| 6,252,300 B1 | 6/2001 | Hsuan et al. |
| 6,323,546 B2 | 11/2001 | Hsuan et al. |
| 6,483,147 B1 | 11/2002 | Lin |
| 2002/0105085 A1* | 8/2002 | Furusawa et al. ............. 257/759 |
| 2005/0090096 A1 | 4/2005 | Hou et al. |
| 2005/0156330 A1 | 7/2005 | Harris |
| 2007/0048994 A1 | 3/2007 | Tuttle |
| 2007/0281474 A1* | 12/2007 | Suzuki et al. ................. 438/677 |
| 2008/0272464 A1 | 11/2008 | Do et al. |

(Continued)

FOREIGN PATENT DOCUMENTS

| CA | 1057411 | 7/1979 |
| DE | 10 2007 034 306 | 4/2009 |

(Continued)

*Primary Examiner* — Timor Karimy
(74) *Attorney, Agent, or Firm* — McDermott Will & Emery LLP (57) ABSTRACT

A substrate (1) of semiconductor material is provided with a contact pad (7). An opening (9) is formed through the semiconductor material from an upper surface to the contact pad, the opening forming an edge (18) at or near the upper surface. A dielectric layer (10) is applied on the semiconductor material in the opening. A metallization (11) is applied, which contacts the contact pad and is separated from the substrate by the dielectric layer. A top-metal (12) is applied, which contacts the metallization at or near the edge. A protection layer (13) is applied, which covers the top-metal and/or the metallization at least at or near the edge, and a passivation (15) is applied.

6 Claims, 7 Drawing Sheets

(56) References Cited

U.S. PATENT DOCUMENTS

2008/0305715 A1\* 12/2008 Ito .................................... 451/8
2009/0038101 A1 2/2009 Duda et al.
2010/0314762 A1 12/2010 Schrank et al.

FOREIGN PATENT DOCUMENTS

| EP | 1376678 | 1/2004 |
| EP | 1564807 | 8/2005 |
| WO | WO 2007/088007 | 8/2007 |

\* cited by examiner

METHOD OF PRODUCING A SEMICONDUCTOR DEVICE AND SEMICONDUCTOR DEVICE HAVING A THROUGH-WAFER INTERCONNECT

RELATED APPLICATIONS

This is a U.S. national stage of application No. PCT/EP2010/064338, filed on Sep. 28, 2010.

This patent application claims the priority of European Patent Application 09012465.2 filed Oct. 1, 2009, the disclosure content of which is hereby incorporated by reference.

FIELD OF THE INVENTION

This invention relates to the manufacturing of semiconductor devices with a vertical electric interconnect through the substrate.

BACKGROUND OF THE INVENTION

Electric interconnects between upper and lower surfaces of a semiconductor substrate are used in the vertical integration of semiconductor devices. The interconnects are formed by vertical vias in the wafer, especially so-called through-silicon vias. To produce the through-wafer interconnects, contact holes are etched in the semiconductor substrate and subsequently filled with an electrically conductive material, which can especially be a metal. The substrate is thinned from the rear side by grinding and polishing until the electrically conductive material in the via hole is exposed. The substrates can be stacked, and the corresponding contact pads can be connected permanently by means of electrically conductive solder or the like. Through-wafer interconnects having diameters of typically about 20 µm to 200 µm can be formed by etching larger recesses having inclined sidewalls.

US 2007/048994 A1 discloses methods for forming through-wafer interconnects and structures resulting therefrom. A substrate is provided with a dielectric layer, a pad on the dielectric layer, and a passivation layer. An aperture is formed through the passivation layer and the pad into the substrate. An insulative layer is deposited in the aperture, followed by a conductive layer and a conductive fill.

DE 10 2007 034 306 describes a through-wafer interconnect which is formed by a via hole in a semiconductor layer and a metallization in an opening of a further semiconductor layer. The semiconductor layers are separated by an isolation layer.

SUMMARY OF THE INVENTION

It is an object of the present invention to disclose a reliable method of producing a semiconductor device having a through-wafer interconnect and a corresponding semiconductor device.

In conjunction with the present invention, the term "through-wafer interconnect" will be used as a general term to denote a through-wafer interconnect, through-wafer contact, through-silicon via or a similar electric conductor: generally an electrically conductive connection that passes through a substrate, wafer or semiconductor body in order to connect electric elements or components that are arranged on opposite surfaces.

The method of producing a semiconductor device having a through-wafer interconnect starts with a wafer or substrate of semiconductor material which is provided with a contact pad. The substrate has an upper surface, and the contact pad is arranged opposite to the upper surface. The contact pad is an electrically conductive material and can especially be a metal. An opening is formed through the semiconductor material from the upper surface to the contact pad. The opening can be formed by means of an etching process. The opening forms an edge of the substrate at or near the upper surface. A dielectric layer is applied on the semiconductor material in the opening. A surface of the contact pad is exposed within the opening. A metallization is applied, which contacts the contact pad and is separated from the semiconductor material by the dielectric layer. A top-metal is applied on the upper surface and over the edge. The top-metal contacts the metallization at or near the edge of the opening. Thus, the top-metal is electrically conductively connected with the contact pad. A protection layer is applied, which covers the top-metal and/or the metallization at least at or near the edge. Then, a passivation is applied, which covers the protection layer.

The protection layer is preferably applied immediately after the deposition of the top-metal in order to protect the metal layers during subsequent process steps. The protection layer can be an oxide of the semiconductor material, especially silicon dioxide, or a nitride of the semiconductor material, especially $Si_3N_4$ or a silicon oxinitride ($SiO_xN_y$). Instead, the protection layer can be formed from a polyimide. The protection layer can also comprise a metal. If a metal is used for the protection layer, the metal is preferably selected with regard to a subsequent exposure to a cleaning agent which is apt to attack metal layers. The cleaning agent may be used, for instance, to remove a substance like residues of a photoresist, particularly a photoresist that had been used as a mask to structure the metallization and/or the top-metal. The selectivity of the chemical attack of the cleaning agent on the substance that is to be removed with respect to its chemical attack on metal should be better for the metal of the protection layer than for the metallization and the top-metal. The protection layer may be TiN, for example.

In a variant of the method and in a corresponding embodiment of the semiconductor device, the protection layer is applied to have a thickness between 0.01 µm and 0.5 µm.

In a further variant of the method, the top-metal and the protection layer are structured together by the same photolithography step.

In a further variant of the method, the dielectric layer is applied all over the surface inside the opening and is etched back to form a spacer on the sidewall of the opening.

The metallization can be tungsten, for example. The top-metal can be aluminum, for example. The top-metal may be structured to form further contact pads of devices integrated in the same substrate.

The substrate can be provided with device structures, especially with an integrated circuit, which may be produced in a standard CMOS technology. The upper surface of the semiconductor body can be covered with an intermetal dielectric containing one or several metal layers forming the wiring of an integrated circuit.

The contact pad can particularly be arranged between the substrate and a further substrate of semiconductor material. In this variant of the method, the contact pad is formed on a surface of the semiconductor material of the further substrate or on a dielectric layer that is applied to a surface of the further substrate. The substrates are stacked and may be permanently fastened to each other by means of a wafer-bonding process. The contact pad is thus buried between the semiconductor bodies of the two substrates. The opening is then etched through the upper substrate from the upper surface to the contact pad.

In a further embodiment, the passivation is formed of at least two layers of different materials. A bottom layer of the passivation can be an oxide of the semiconductor material, on which a further layer formed from a nitride of the semiconductor material can be applied.

BRIEF DESCRIPTION OF THE DRAWINGS

Examples and embodiments of the method and the semiconductor device are described in the following detailed description in conjunction with the appended figures.

DETAILED DESCRIPTION OF THE DRAWINGS

Figure 1:
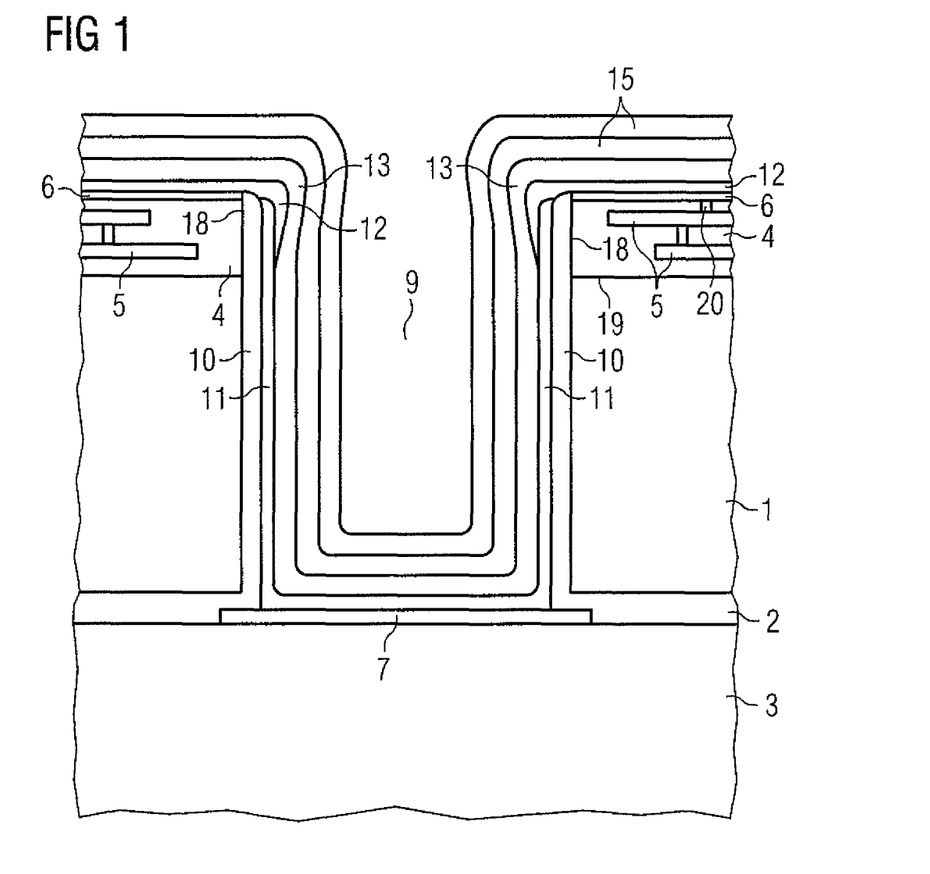
FIG. 1 shows a cross-section of an embodiment of the semiconductor device in the region of a through-wafer interconnect.

FIG. 1 shows a cross-section of an arrangement of two substrates 1, 3, which are bonded with an isolation layer 2 arranged between the substrates 1, 3. A through-wafer interconnect is formed in the upper substrate 1, which comprises a semiconductor layer or semiconductor body. The substrates 1, 3 may further comprise electronic devices, especially components of an integrated circuit, not shown in FIG. 1, like microelectromechanical or micromachined devices or photonic devices, for example. An intermetal dielectric 4 can be arranged on an upper surface 19 of the substrate 1. Metal layers 5 may be arranged in the intermetal dielectric 4 to form a wiring, which may be provided for an integrated circuit and is shown only schematically. An optional liner 6 is preferably applied on the upper surface of the intermetal dielectric 4. The liner 6 can comprise Ti, especially a layer sequence of Ti and TiN. An electrically conductive contact pad 7 is arranged in the isolation layer 2 between the substrates 1, 3.

The through-wafer interconnect is formed in an opening 9 passing through the upper substrate 1 and reaching down to the contact pad 7. A dielectric layer 10 covers the sidewall of the opening 9, preferably in the shape of a sidewall spacer. The metallization 11 contacts the electrically conductive contact pad 7 and forms a vertical metallic conductor of the through-wafer interconnect. The metallization 11 preferably extends approximately to the upper edge 18 of the opening 9, where the metallization 11 is contacted by a top-metal 12. On the upper surface of the device, the top-metal 12 can be structured into conductor tracks, pads and the like. Thus an electrically conductive connection is produced between the contact pad 7 and electric conductors on the upper surface.

The liner 6 can be provided as an electric conductor connecting the top-metal 12 with a terminal. The liner 6 can instead be omitted, especially if an electric connection between the top-metal 12 and a metal layer 5 of the wiring is formed by a plug 20 or a similar vertical connection.

A protection layer 13 covers both the metallization 11 and the top-metal 12 to protect the metallization 11 and the top-metal 12, especially in the vicinity of the edge 18. A passivation 15 is applied on top of the protection layer 13. The passivation 15 can comprise one homogeneous layer or, as shown in FIG. 1, two or more layers of different materials. A first layer of the passivation 15, applied immediately on the protection layer 13, can be an oxide of the semiconductor material, particularly $SiO_2$. A further layer of the passivation 15 can especially be a nitride of the semiconductor material, $Si_3N_4$ for instance.

The further substrate 3 may also be provided with an electronic circuit and a wiring similar to the wiring formed by the intermetal dielectric 4 and the metal layers 5 of the substrate 1. The wiring of the further substrate 3 may be arranged on the side facing the isolation layer 2 or on the opposite rear side of the further substrate 3.

Figure 2:
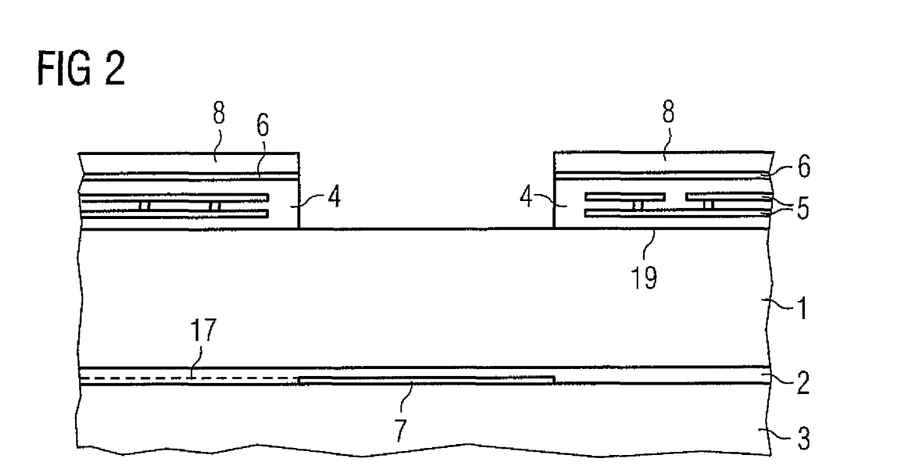
FIG. 2 shows a cross-section of a first intermediate product of an example of the method.

FIG. 2 shows a cross-section of an intermediate product of an example of the method. A buried contact pad 7 is arranged in an isolation layer 2 between two substrates 1, 3 of semiconductor material. The conductor track 17 shown with a broken line in FIG. 2 can be additionally provided as an electric connection of the contact pad 7 within the isolation layer 2. An intermetal dielectric 4, which can be an oxide of the semiconductor material, is disposed on the upper surface 19, opposite to the isolation layer 2, and contains metal layers 5 of a wiring. The intermetal dielectric 4 is preferably covered by a liner 6, which can be Ti/TiN, for example.

The arrangement of the substrates 1, 3 shown in FIG. 2 can be produced by a process of wafer-bonding, known per se, by which two semiconductor substrates or wafers are bonded by means of a bonding layer, which can be a dielectric layer, particularly an oxide of the semiconductor material. An upper surface of one of the substrates 3 is provided with the isolation layer 2, which is then permanently fastened to a rear surface of the other substrate 1. The isolation layer 2 can be used as the bonding layer, or a dedicated bonding layer can be applied to the upper surface of the isolation layer 2. When the substrates 1, 3 are bonded, the isolation layer 2 is embedded from its upper and lower sides within semiconductor material. The contact pad 7 is produced and structured at the provided location before the substrates 1, 3 are bonded. After the bonding of the substrates 1, 3, the contact pad 7 is buried in the manner shown in FIG. 2.

A mask 8, which can be a hard mask or a photoresist mask, for example, is arranged on the liner 6. FIG. 2 shows the intermediate product that is obtained after a partial removal of the intermetal dielectric 4 in the region not covered by the mask 8. Then the opening 9 is formed in the semiconductor material of the substrate 1.

The opening 9 can be produced by an etching process. If the mask 8 is a thick photoresist and the liner 6 is Ti/TiN and the intermetal dielectric 4 is an oxide of the semiconductor material, the liner 6, the intermetal dielectric 4 and the semiconductor material of the substrate 1 can be removed with reactive iron etching (RIE), removing the liner 6 and the intermetal dielectric 4, followed by deep reactive iron etching (DRIE), removing the semiconductor material down to the isolation layer 2. The etching stops on the isolation layer 2.

Figure 3:
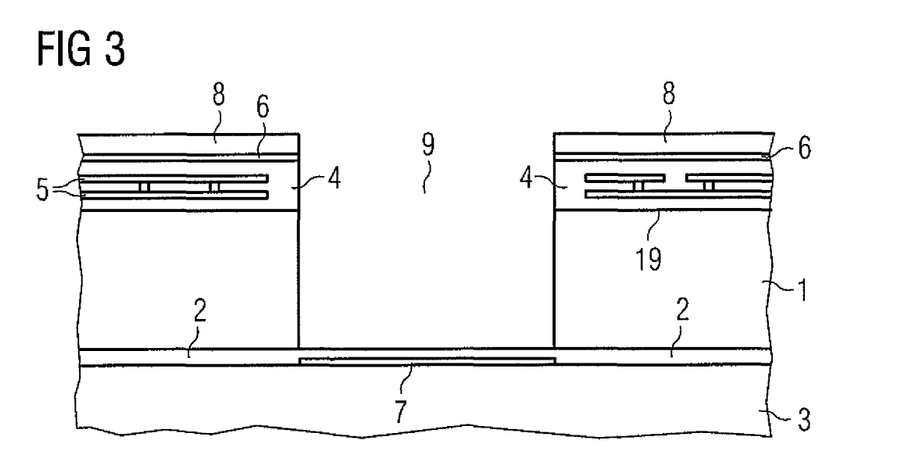
FIG. 3 shows a cross-section according to FIG. 2 after the etching of an opening through the substrate.

FIG. 3 shows a further intermediate product after the etching of the opening 9. The isolation layer 2 is now laid bare in the opening 9, which goes through the whole semiconductor layer of the substrate 1, so that a semiconductor surface is present only on the sidewall of the opening 9.

Figure 4:
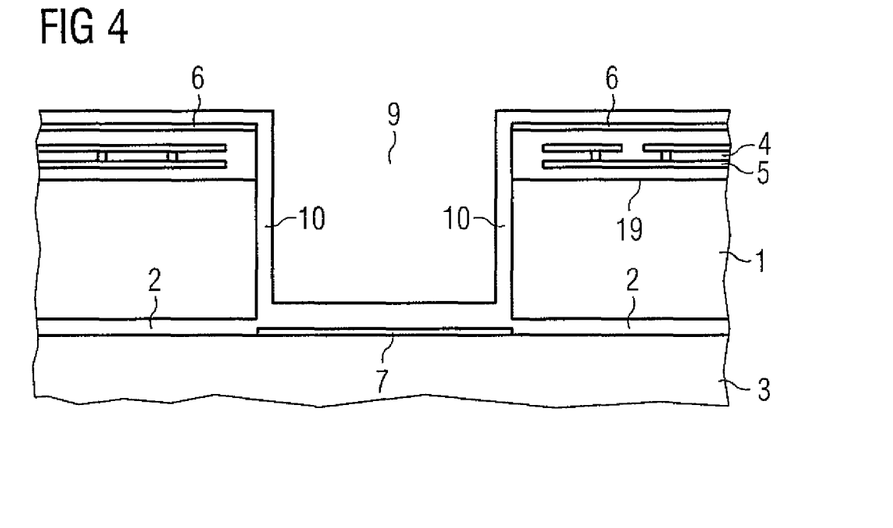
FIG. 4 shows a cross-section according to FIG. 3 after the application of a dielectric layer.

FIG. 4 shows a cross-section according to FIG. 3 after the application of a dielectric layer 10, which can especially be silicon dioxide. FIG. 4 does not show a limit between the dielectric layer 10 and the isolation layer 2 in order to indicate that both layers can be formed from oxide. The dielectric layer 10 is preferably applied on the whole surface and later partially removed. The dielectric layer 10 can be applied by chemical vapor deposition (CVD), especially sub-atmospheric chemical vapor deposition (SACVD). These processes are known per se in semiconductor technology.

Figure 5:
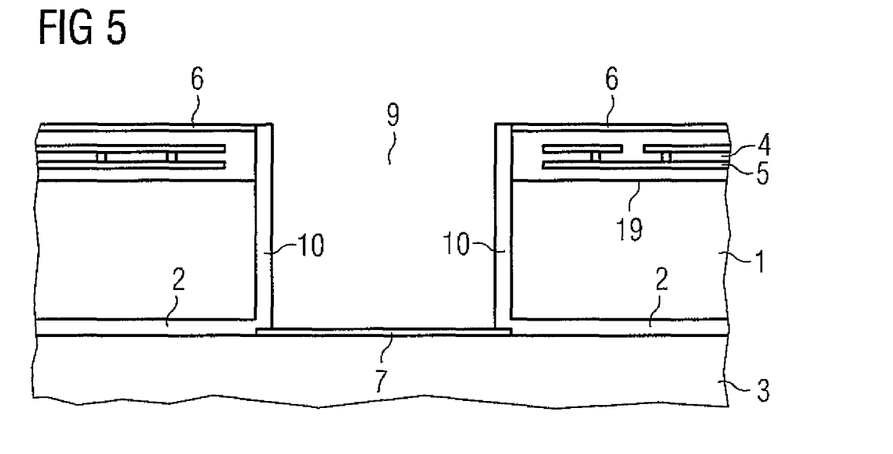
FIG. 5 shows a cross-section according to FIG. 4 after a partial removal of the dielectric layer.

FIG. 5 shows the cross-section according to FIG. 4 after the partial removal of the dielectric layer 10, except for a residual portion on the sidewall of the opening 9. At the bottom of the opening 9, the contact pad 7 is now exposed. The partial removal of the dielectric layer 10 can be effected by means of reactive iron etching, for example, the liner 6 functioning as an etching stop layer. The etching process is preferably performed anisotropically, so that the dielectric layer 10 is completely removed from the horizontal surfaces and a residual portion is left as a sidewall spacer in the opening 9. These method steps are known per se in semiconductor technology from the formation of sidewall spacers.

Figure 6:
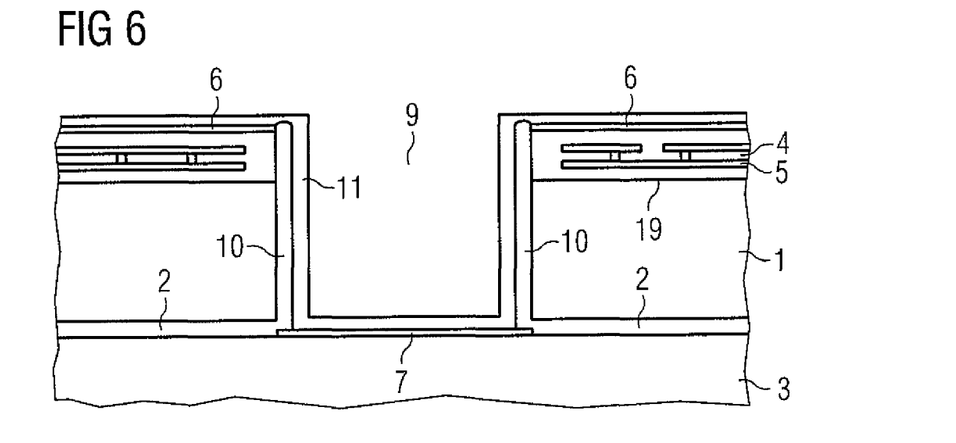
FIG. 6 shows a cross-section according to FIG. 5 after the application of a metallization.

FIG. 6 shows a cross-section according to FIG. 5 after an application of a metallization 11. The metallization 11 can be deposited by metal-organic chemical vapor deposition (MOCVD) and can especially be an isotropic deposition of tungston. The metallization 11 may be applied to the whole surface and afterwards partially removed without use of a mask. This process is performed so that the etching rate is higher on the upper surface than in the opening 9. Therefore sufficient metal remains on the contact pad 7 to connect the contact pad 7 electrically with the vertically extending portion of the metallization 11, which remains on the sidewall of the opening 9.

Figure 7:
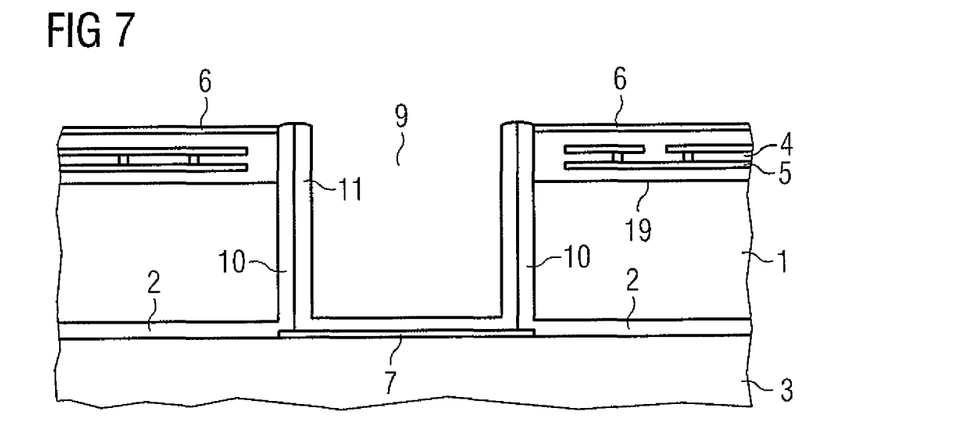
FIG. 7 shows a cross-section according to FIG. 6 after a partial removal of the metallization.

FIG. 7 shows a cross-section according to FIG. 6 after the removal of the upper horizontal portion of the metallization 11 from the surface of the liner 6. The remaining portion of the metallization 11 is still in contact with the contact pad 7 and electrically insulated from the semiconductor material by the sidewall spacer formed by the dielectric layer 10.

Figure 8:
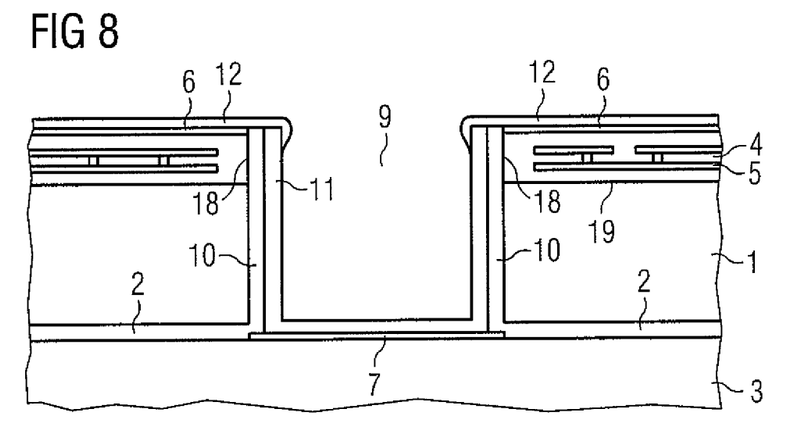
FIG. 8 shows a cross-section according to FIG. 7 after the application of a top-metal.

FIG. 8 shows a cross-section according to FIG. 7 after the application of a top-metal 12. When the top-metal 12 is deposited, the metallization 11 is contacted in situ, because an overhang of the top-metal 12 is formed at or near the edge 18 of the opening 9, and the overhang makes a contact with the metallization 11. The top-metal 12 can be aluminum, for instance.

Figure 9:
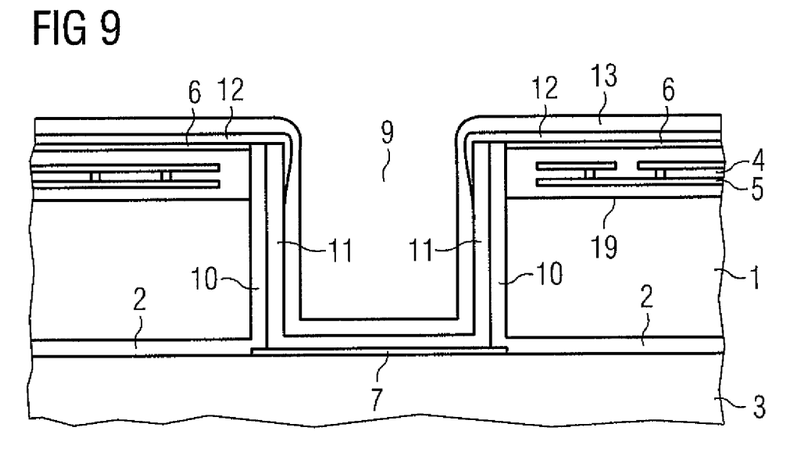
FIG. 9 shows a cross-section according to FIG. 8 after the application of a protection layer.

FIG. 9 shows a cross-section according to FIG. 8 after the application of a protection layer 13. The protection layer 13 can be an oxide of the semiconductor material, especially silicon dioxide, a nitride of the semiconductor material, especially silicon nitride or silicon oxinitride, a polyimide or a metal. It can be deposited by means of plasma-enhanced chemical vapor deposition (PECVD), for example. The protection layer 13 can be applied to have a layer thickness of typically between 0.01 µm and 0.5 µm, for example. If the protection layer 13 is formed from a metal, the metal is preferably selected so that it provides a better selectivity than the top-metal 12 with respect to substances removed in a later cleaning process.

The protection layer allows to remove photoresist residues after the metal etch in a most effective and robust way. The photoresist is used to form a mask for the etching of the metal layers, especially aluminum and tungsten. The selectivity of the subsequent dry and wet cleaning step, by which the photoresist residues are removed, versus the metals is not very good. As a result, the metals are attacked or etched and may even be partially removed. With the protection layer covering the metal, more efficient cleaning agents can be used to remove the photoresist residues completely. The connection between the top-metal 12 and the metallization 11 near the edge 18 of the opening 9 is thus not impaired by the cleaning step. This improves the reliability of the device.

Figure 10:
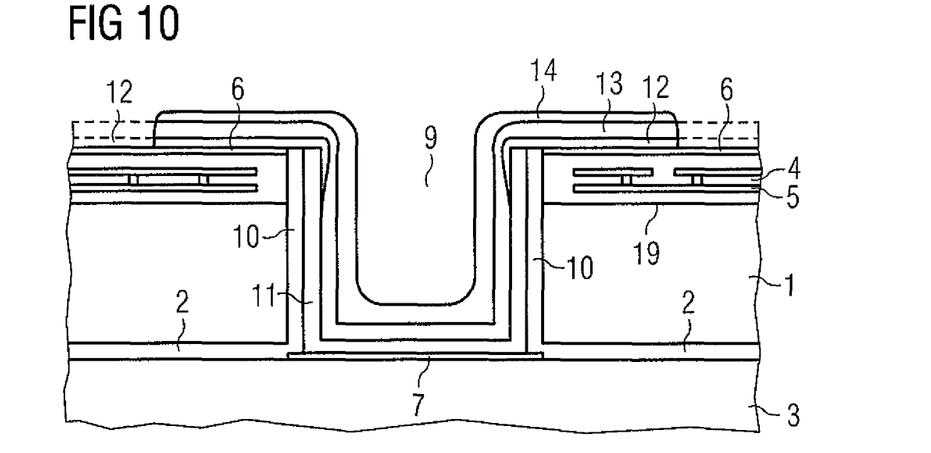
FIG. 10 shows a cross-section according to FIG. 9 after the application of a mask.

FIG. 10 shows a cross-section according to FIG. 9 after the application of a further mask 14, which can be a resist mask. The protection layer 13 and the top-metal 12 can be patterned in the same process step using the resist mask 14. This is indicated in FIG. 10 by the boundaries of the top metal 12 and the protection layer 13 being represented by broken lines in the region where these layers are removed.

Figure 11:
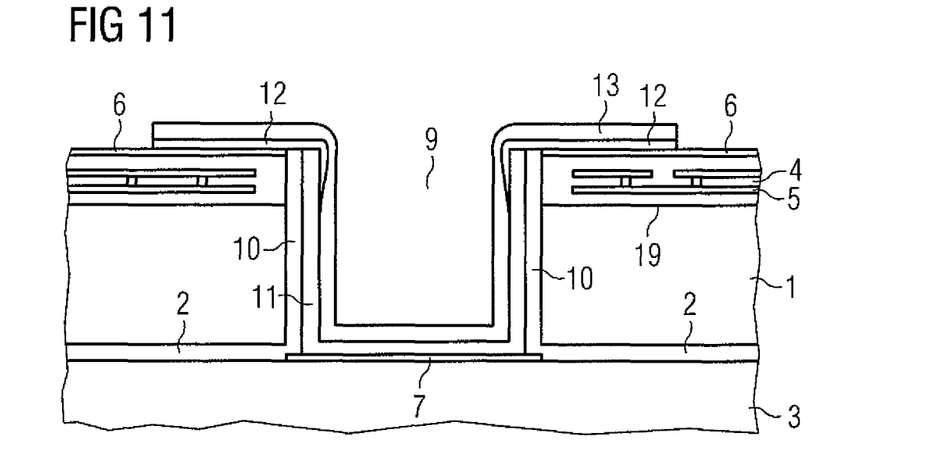
FIG. 11 shows a cross-section according to FIG. 10 after a partial removal of the top-metal and the protection layer and after the removal of the mask.

FIG. 11 shows a cross-section according to FIG. 10 after the patterning of the protection layer 13 and the top-metal 12 and after the removal of the further mask 14. If the protection layer 13 is silicon dioxide, for example, the further mask 14 can be removed by a strip process which is selective with respect to the oxide. This can be a plasma ashing with $CF_4$ content, for example, or a wet clean using hydrogen peroxide ($H_2O_2$), sulfuric acid ($H_2SO_4$) or combinations thereof, for example.

Figure 12:
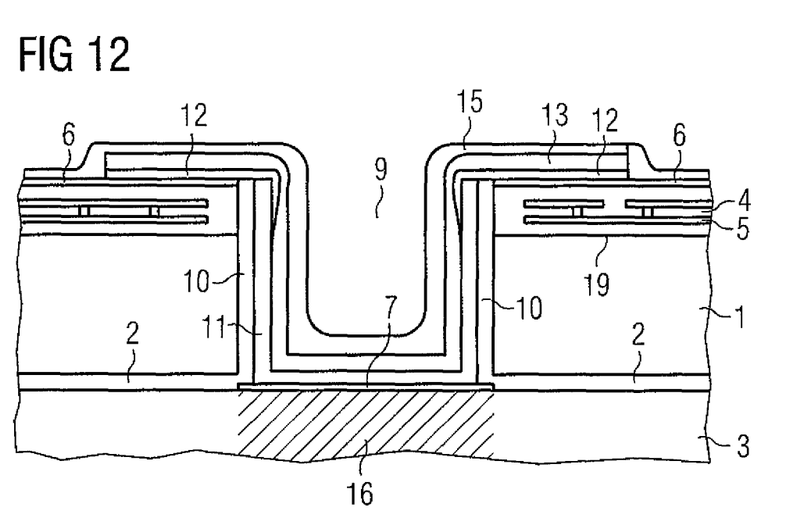
FIG. 12 shows a cross-section according to FIG. 11 after the application of a passivation.

FIG. 12 shows a cross-section according to FIG. 11 after the application of the passivation 15. The through-wafer interconnect can be continued into the further substrate 3 by removing the semiconductor material from the rear region 16 under the contact pad 7, thus producing an opening in the further substrate 3. The rear region 16 to be removed is indicated by the hatching in FIG. 12. An electric conductor extending vertically through the further substrate 3 can then be arranged in this opening in contact with the rear surface of the contact pad 7. Then the through-wafer interconnect passes through both substrates 1, 3.

If residues of a resist are not completely removed during the process, the passivation will be deposited on the residues, and the reliability of the device is adversely affected, because the residues might cause the passivation to delaminate, thus provoking a malfunction of the device. This is avoided by the application of the protection layer 13. The metallization 11 and the top-metal 12 are protected by the protection layer 13 during the cleaning process.

The invention is not limited by the description with reference to the working examples. Instead, the invention encompasses any new feature and any combination of features, which especially includes any combination of features in the claims, even if this feature or this combination itself is not mentioned explicitly in the claims or working examples.

LIST OF REFERENCE NUMERALS 1 substrate
2 isolation layer
3 further substrate
4 intermetal dielectric
5 metal layer
6 liner
7 contact pad
8 mask
9 opening
10 dielectric layer
11 metallization
12 top-metal 13 protection layer
14 further mask
15 passivation
16 rear region
17 conductor track
18 edge
19 upper surface
20 plug

The invention claimed is:

1. A method of producing a semiconductor device, comprising:
   providing a substrate of semiconductor material with a contact pad, the substrate having an upper surface and the contact pad being arranged opposite to the upper surface;
   forming an opening through the semiconductor material from the upper surface to the contact pad, the opening forming an edge of the substrate at or near the upper surface;
   applying a dielectric layer on the semiconductor material in the opening;
   applying a metallization, wherein the metallization contacts the contact pad and is separated from the semiconductor material by the dielectric layer;
   applying a top-metal on the upper surface and over the edge, the top-metal contacting the metallization;
   applying a protection layer, wherein the protection layer is selected from the group consisting of an oxide, a nitride of the semiconductor material, an oxinitride of the semiconductor material, and a polyimide, and wherein the protection layer covers the top-metal and the metallization at least at or near the edge;
   structuring the top-metal and the protection layer together by a photolithography step; and
   applying a passivation.

2. The method of claim 1, wherein the protection layer is an oxide of the semiconductor material.

3. The method of claim 1, wherein the protection layer is a nitride or an oxinitride of the semiconductor material.

4. The method of claim 1, wherein the protection layer is a polyimide.

5. The method according to claim 1, wherein the protection layer is applied so that it has a thickness between 0.01 μm and 0.5 μm.

6. The method according to claim 1, further comprising:
   forming the passivation with at least two layers of different materials.

* * * * *